United States Patent [19]
Ochi et al.

[11] 4,081,841
[45] Mar. 28, 1978

[54] SOLID STATE IMAGE SENSOR

[75] Inventors: Shigeyuki Ochi, Machida; Yoshiaki Hagiawara, Yokohama, both of Japan

[73] Assignee: Sony Corporation, Tokyo, Japan

[21] Appl. No.: 723,328

[22] Filed: Sep. 15, 1976

[30] Foreign Application Priority Data

Sep. 18, 1975 Japan .................................. 50-113354

[51] Int. Cl.² .............................................. H04N 5/30
[52] U.S. Cl. .................................. 358/213; 250/211 J; 250/578
[58] Field of Search ................. 358/212, 213; 250/578, 250/211 J, 211 R

[56] References Cited

U.S. PATENT DOCUMENTS 3,904,818  9/1975  Kovac ............................... 358/213 X

Primary Examiner—Robert L. Richardson
Attorney, Agent, or Firm—Hill, Gross, Simpson, Van Santen, Steadman, Chiara & Simpson

[57] ABSTRACT

In an interline type charge coupled device imaging device, a single vertical shift resister transfers sampled image carriers generated at image sensing cells vertically aligned on both sides thereof. The transfer electrode of the vertical shift register preferably extends to a front edge of a narrow portion of the shift register surrounded by channel stopper regions.

Further, the output signal from the imaging device is processed by mixing two successive line signals, so that the sensing cells are aligned in a zig-zag pattern on both sides of each vertical shift register.

10 Claims, 25 Drawing Figures

SOLID STATE IMAGE SENSOR

BACKGROUND OF THE INVENTION

1. Field of the Invention

This invention relates generally to a solid state television camera, and more particularly to such a camera employing a charge coupled device (CCD) using an interline transfer system.

2. Description of the Prior Art

This invention is made to improve the invention disclosed in the Japanese pending application No. 12740/1975, filed Jan. 30, 1975 U.S. Ser. No. 652,116, filed Jan. 26, 1976, now U.S. Pat. No. 4,012,587. That is, electric charges (image carriers) are transferred more effectively in the vertical shift register of the CCD imaging device employing an interline transfer system.

After experiments of the invention of the above prior Japanese application had been carried out, the following defects are discovered. As may be described later in detail, the vertical shift register has narrow portions surrounded by channel stoppers, and the depth of potential well corresponding to such portions becomes shallow upon carrier transfer. As a result, complete transfer of carriers is prevented. Further, the carriers transferred to the vertical shift register are apt to be re-injected to the sensing cells upon the carrier transfer. Due to such defects, the invention disclosed in the above prior application can not be practised even though it has various advantages.

OBJECTS AND SUMMARY OF THE INVENTION

Accordingly, it is a primary object of this invention to provide a new solid state imaging device to be applied to a television camera.

It is another object of this invention to provide a new and useful solid state imaging device of the type which employs an interline transfer type charge coupled image sensor.

It is further another object of this invention to provide a novel interline transfer type charge coupled imaging device, wherein one row of vertical shift registers is disposed relative to every two rows of image sensing cells.

It is still another object of this invention to provide an interline transfer type CCD imager, wherein electrodes of each vertical shift register alternately extend to both sides thereof for the sake of transfer efficiency.

According to an aspect of this invention there is provided a solid state imaging device which comprises a plurality of sensing cells aligned in both horizontal and vertical directions, a plurality of vertical shift registers positioned between every two lines of said sensing cells aligned in the vertical direction, each of said vertical shift registers having plural sets of transfer and storage portions, said plural sets of transfer and storage portions being alternately extended to both sides of the vertical alignment of said vertical shift register, and said transfer portion coinciding with the edge of said narrow portion formed between every two sets of said transfer portion and storage portion, and a horizontal shift register for receiving image carriers from said vertical registers and for deriving an output video signal.

The other objects, features and advantages of the invention will be cleared out by the later part of this specification explaining the invention after the description of the corresponding prior art invention taken in conjunction with the attached drawings through which the like reference numerals and letters designate like elements.

DESCRIPTION OF THE PREFERRED EMBODIMENTS

In order to better understand this invention, a prior art typical solid state imaging device or imager of an interline transfer system, in which a CCD (charge coupled device) is used, will be described with reference to FIG. 1.

Figure 1:
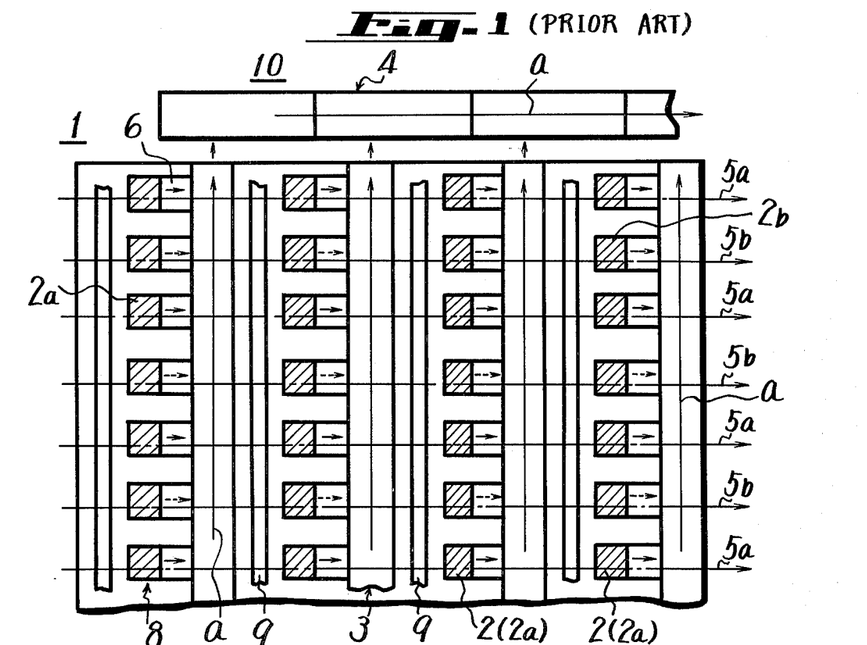
FIG. 1 shows a symbolic diagram of an interline transfer type charge coupled imager of the prior art.

FIG. 1 is a theoretical diagram of the solid state imager. In FIG. 1, 10 generally designates the solid state imager. This solid state imager 10 consists of a common semiconductor substrate 1, a number of image sensing cells 2 each of which forms one picture element and which are aligned on the substrate 1 in a matrix, vertical shift registers 3 extended in the vertical direction on the substrate 1 the number of which is selected same as that of sensing cells 2 in the horizontal scanning line or horizontal picture elements, and a horizontal shift register 4 which transfers stored electric charges or carriers to the output terminal side. In order to obtain an output video signal from the solid state imager 10, minority carriers stored in the respective image sensing cells 2 in accordance with light informations are once transferred (parallel-transferred) to the vertical shift resistors 3 at every vertical line, then sequentially transferred in the vertical direction (serial-transferred) by the respective vertical shift register 3 and read out at every one horizontal scanning line through the horizontal shift register 4. Thus, a desired video output signal can be delivered to the output terminal of the horizontal shift register 4.

In the solid state imager 10 shown in FIG. 1, the vertical rows (column) of the sensing cells 2 and the vertical shift registers 3 are arranged alternately, so that the above transfer system is generally called as an interline shift (or interline transfer) system.

In FIG. 1, plural arrows a indicate transfer directions of image carriers, but when the scanning system of an interlace is employed, dotted-line arrows indicate the transfer directions of image carriers in certain even fields. Therefore, in odd fields the image carriers are transferred in the directions indicated by solid-line arrows only.

In the solid state imager 10 shown in FIG. 1, picture elements (or sensing cells) on odd horizontal scanning lines 5a are marked with 2a, and those on even horizontal scanning lines 5b are marked with 2b, respectively.

In order to reduce the number of image sinsing cells or picture elements in the horizontal direction without deteriorating especially the horizontal resolution and to much improve the carrier transfer efficiency by increasing the area of the electrode of the vertical shift register in the above described solid state imager employing the interline transfer system, it is, for example, sufficient that a single vertical shift register 3 is used for the arrays of two sensing cells 2 commonly and the arrays of two sensing cells 2 are arranged in zig-zag for the vertical shift resistors 3.

Figure 2:
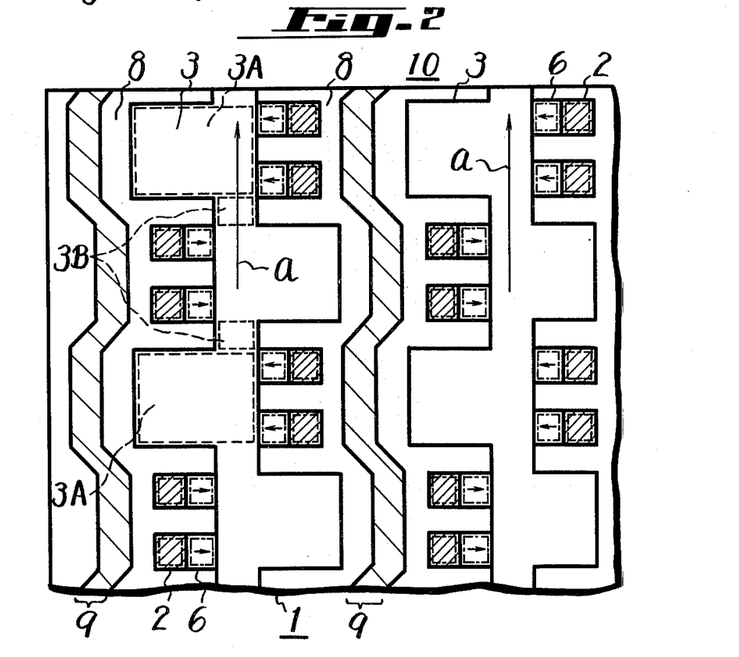
FIG. 2 shows a symbolic diagram of a modified interlinetransfer type CCD imager related to this invention.

That is, as shown in FIG. 2, one vertical shift register 3 is used for adjacent rows of the picture elements. To this end, the vertical shift register 3 is located between two rows of the image sensing cells or picture elements and the image carriers produced in two adjacent rows of sensing cells are transferred by the single vertical shift register 3. The plural image sensing cells are arranged in a zig-zag pattern with respect to the vertical shift register 3.

In the example shown in FIG. 2, the solid state imager 10 employs the interlace scanning system, so that two image sensing cells make one set and a plurality of image sensing cell sets are arranged zig-zag. The vertical shift register 3 is expanded to occupy the region where the image sensing cell sets are omitted so as to increase the area of the vertical shift register 3. If the expanded portions of the vertical shift registers 3 are designated as enlarged portions 3A, these enlarged portions 3A are also arranged in a zig-zag pattern. The regions of the vertical shift register 3 disposed between the enlarged portions 3A will be called as narrow portions 3B.

In FIGS. 1 and 2, 6 indicates. gate regions each formed between the image sensing cell 2 and the vertical shift register 3, and 8 indicates the regions of channel stoppers which are formed to surround the vertical shift register 3 and plural image sensing cells 2, respectively. Within the regions of channel stoppers 8 there are formed over flow drain regions 9 which serve to drain excess carriers in the image sensing cells 2. In this case, the conductivity type of the region 9 is selected to be different from that of the semiconductor substrate 1, that is, if the substrate 1 is of an N-type, the region a is of a $P^+$-type, by way of example. In this case, the channel stopper 8 is selected to be of an $N^+$-type.

If the solid state imager 10 is constructed as shown in FIG. 2, it will be apparent that the number of image sensing cells 2 and the number of the vertical shift registers 3 can be reduced by more than ½ as compared with those of the prior art solid state imager 10 shown in FIG. 1 and that the picture quality not so deteriorated by utilizing the vertical correlation even though their detailed description is omitted. For this reason, the construction of the imager can be simplified without deteriorating its resolution. Further, since the area of the vertical shift register 3 can be expanded, the carrier transfer efficiency can be greatly improved. The reason thereof will be omitted here since it was described in the above Japanese application No. 12740/75 in detail.

In order to drive the vertical shift register 3 of the solid state imager 10 having the above-mentioned features, a two-phase clock system is generally employed. That is, first and second electrodes are located successively and alternately on the vertical shift register 3 at desired positions, first and second transfer clocks (transfer signals) are applied to the first and second electrodes, and thus, the image carriers obtained at the respective image sensing cells 2 are transferred to the horizontal shift register 4.

Figure 3:
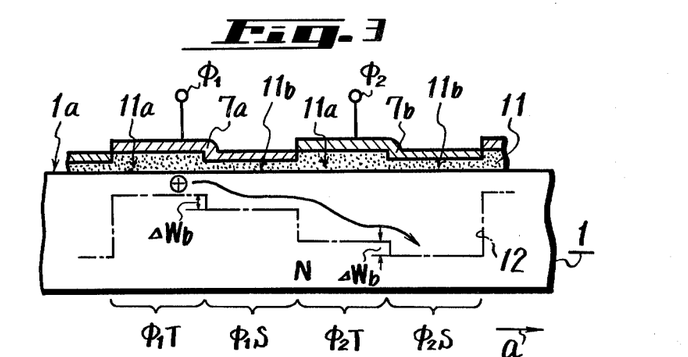
FIG. 3 shows relations between electrodes and potential wells for explaining a transfer mechanism of two phased type CCD register employed in this invention.

In this case, as shown in FIG. 3, first and second electrodes $\phi_1$ and $\phi_2$ are formed on the major surface 1a of the substrate 1 through an insulating layer 11 made of, for example $S_iO_2$. In FIG. 3, 7a and 7b indicate conductive layers serving as the electrodes, respectively. The insulating layer 11 is so formed that its thickness is different in the carrier transfer direction (in the lateral direction in FIG. 3).

Figure 4:
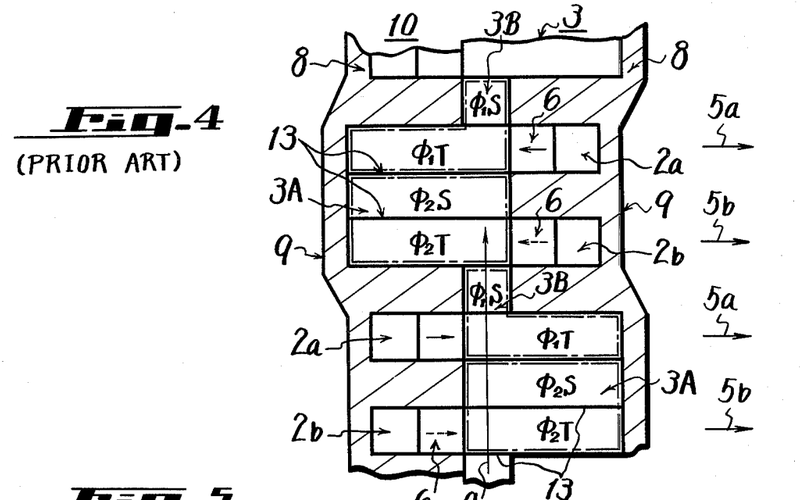
FIG. 4 is an enlarged top view of the shift register and sensing cells of the prior art CCD imager.

As shown in FIG. 4 which shows a top plan view of a part of the solid state imager 10 in enlarged scale, if it is assumed that an electrode corresponding to the image sensing cell 2a located on the odd horizontal scanning line 5a is taken as the first electrode $\phi_1$ and an electrode corresponding to the image sensing cell 2b located on the even horizontal scanning line 5b as the second electrode $\phi_2$, these electrodes $\phi_1$ and $\phi_2$ are considered as regions, respectively, and the front halves thereof in the transfer direction a serve as transfer regions, while the rear halves thereof serve as storage regions, respectively. Now, if the former regions are marked with $\phi_1T(\phi_2T)$ and the latter regions with $\phi_1S(\phi_2S)$, respectively, the thickness of an insulating layer 11a corresponding to the transfer region $\phi_1T(\phi_2T)$ is selected greater than that of an insulating layer 11b corresponding to the storage region $\phi_1S(\phi_2S)$ to give a difference to a potential well 12 which may be established in the substrate 1.

Accordingly, if the levels (voltages) of transfer signals which may be applied to the electrodes $\phi_1$ and $\phi_2$ are selected to have a difference, such as a potential well 12 whose depth is increased in step manner in the transfer direction a as shown in FIG. 3. Thus, the image carriers can be positively transferred in the direction of the arrow (the transfer direction a). That is, both the transfer and storage regions are provided and the thickness of the insulating layer 11 is made different so as to positively transfer the image carriers.

In FIG. 4, solid lines 13 drawn within the enlarged portions 3A and between the narrow and enlarged portions 3B and 3A show the stepped portions of the insulating layer 11.

Figure 5:
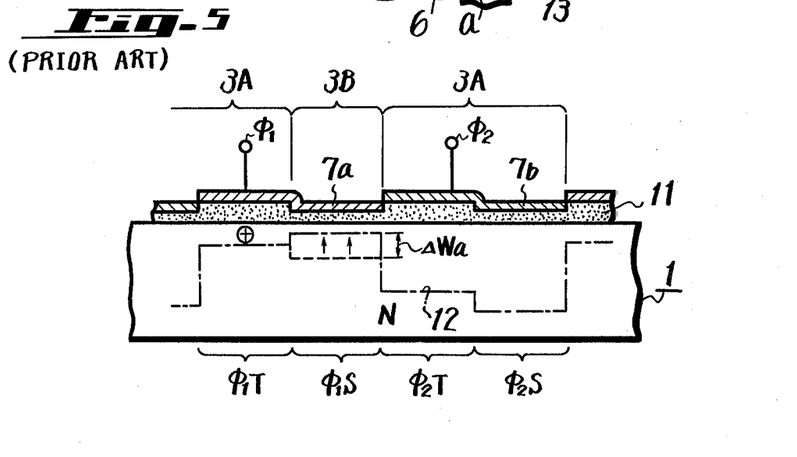
FIG. 5 is a sectional view of the shift register of FIG. 4 for the explanation of disadvantages of the prior art CCD imager.

In the case where the potential well 12 shown in FIG. 3 is provided by the above construction, there occurs a case where the image carriers can not be transferred by the selection of electrodes located on the narrow portions 3B. That is, due to the design of the solid state imager 10, it is inevitable that the width of the narrow portion 3B (in the direction perpendicular to the transfer direction $a$) is very small (for example, in the order of 10 $\mu$m) and, in addition, the channel stoppers 8 exist in the width direction of the narrow portions 3B, so that the depth of the potential well 12 to be formed beneath the narrow portions 3B becomes very shallow as compared with the designed value. If it is assumed that the depth of the potential well 12 becomes shallower by $\Delta W_a$ than that of the designed value and this potential $\Delta W_a$ is greater than that of $\Delta W_b$ shown in FIG. 3 and if it is selected that the storage region $\phi_1 S$ of the electrode $\phi_1$ is located on the narrow portion 3B as shown in FIG. 4, the potential well 12 becomes as shown in FIG. 5 in which the depth of the potential well beneath the narrow region 3B is shallower than that at its front edge. As a result, the image carrier can not be transferred which is a fatal defect.

As described above, the prior art solid state imager with the pattern shown in FIG. 2 can not be free from the above defect (low carrier transfer efficiency), so that it has not been practised up to now.

An example of the invention will be described hereinbelow with reference to the drawings.

Figure 6:
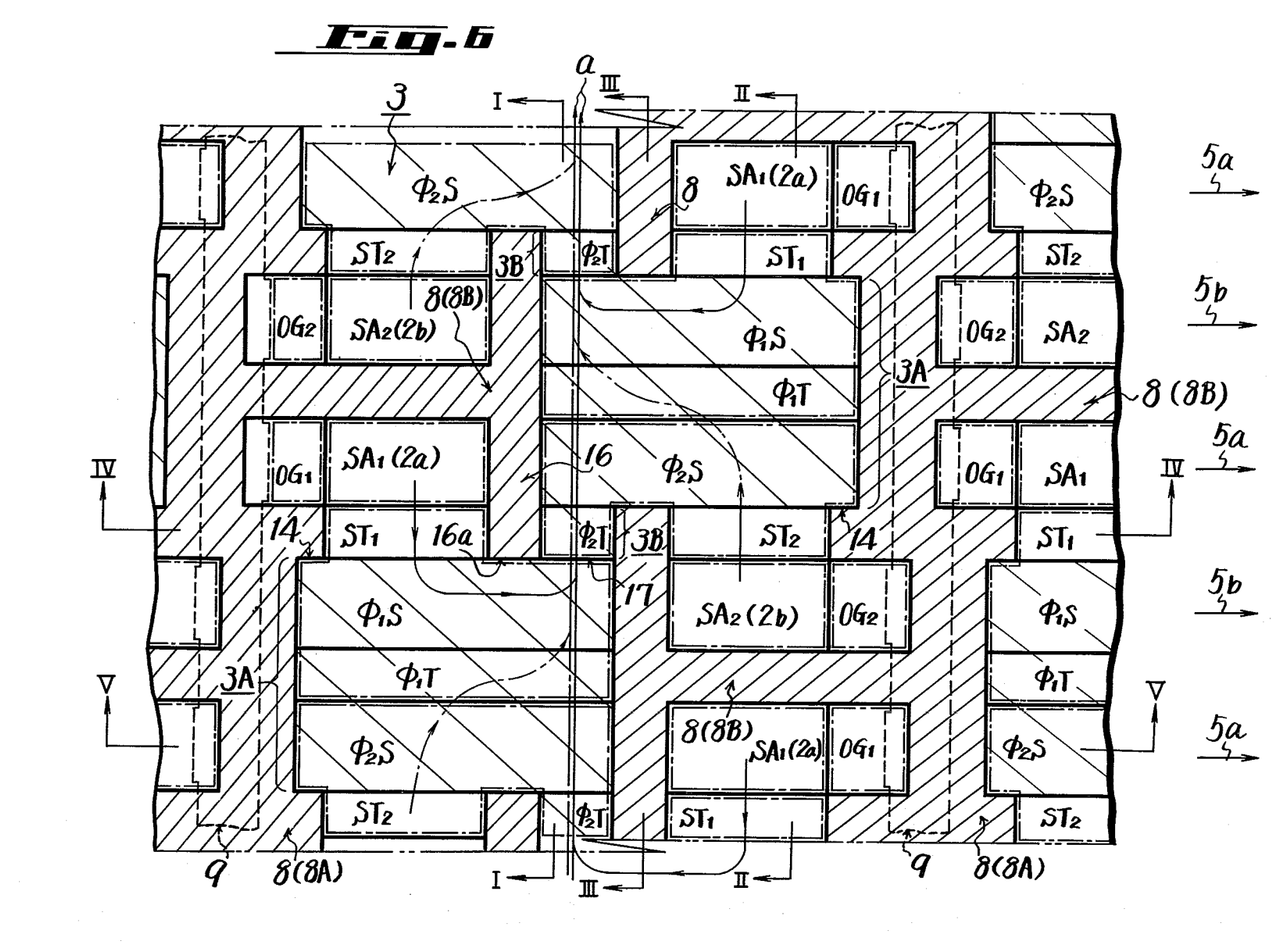
FIG. 6 is a top view of an interline transfer type CCD imager of this invention.

FIG. 6 shows an example the solid state image sensor or imager according to the invention which has its base on the solid state imager with the image sensing cells in a zig-zag pattern as shown in FIG. 2 and develops the same further.

Figure 7A:
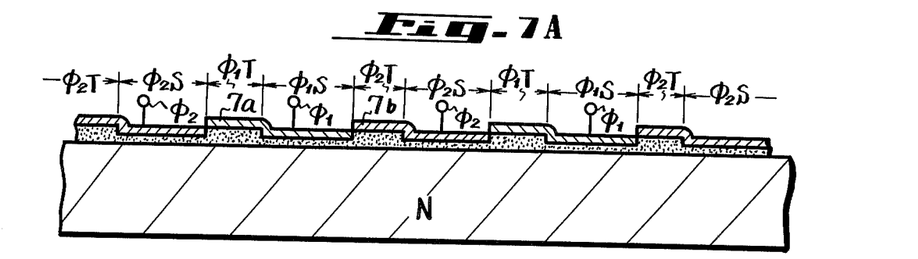
FIG. 7A to FIG. 7C, inclusive, are sectional views of the CCD imager of FIG. 6, respectively, cut out at lines I—I, II—II and III—III in FIG. 6.
Figure 7B:
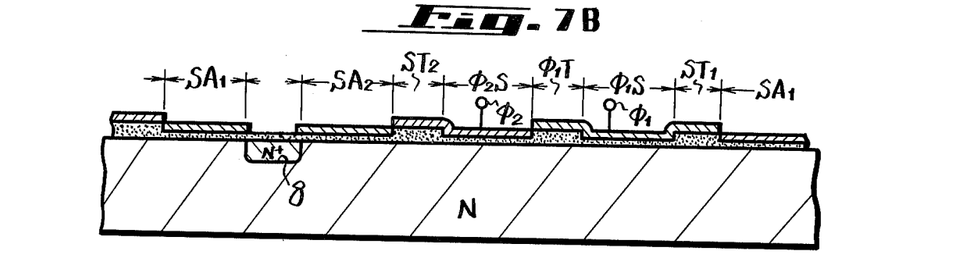
Figure 7C:
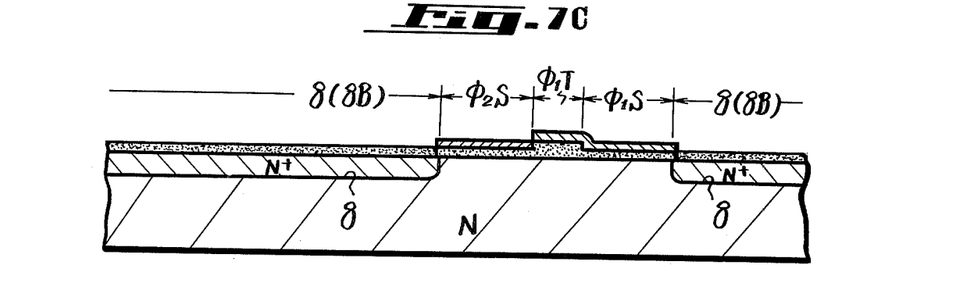
Figure 8A:
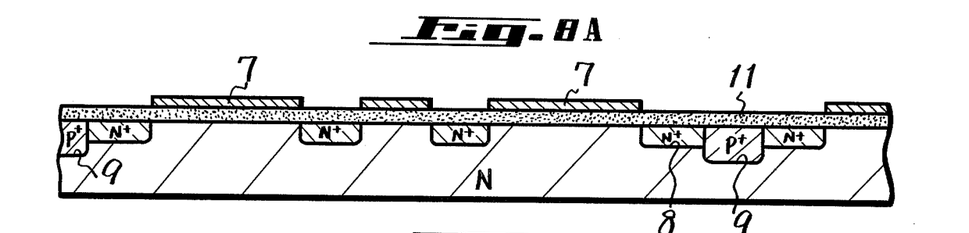
FIGS. 8A and 8B are also sectional views of the CCD imager shown in FIG. 6 at lines IV—IV and V—V in FIG. 6.
Figure 8B:
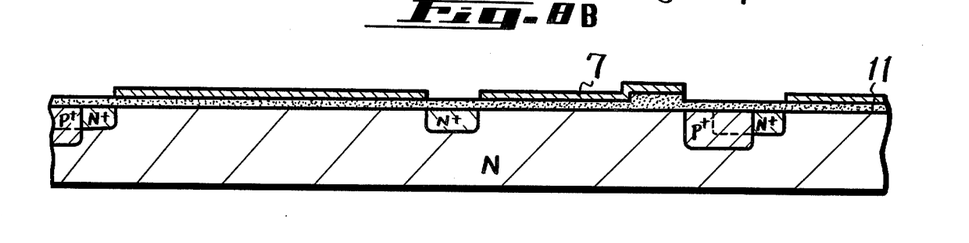

FIGS. 7A to 7C are cross-sectional views on the lines I—I; II—II; and III—III in FIG. 6, respectively, and FIGS. 8A and 8B are sectional views on the lines IV—IV and V—V in FIG. 6, respectively.

The solid state imager 10 of the invention will be described in outline. In FIG. 6, the regions with oblique lines down to the right designate a vertical shift register 3 which consists of enlarged portions 3A and narrow portions 3B as shown in FIG. 6. In this case, the enlarged portion 3A are, of course, located in a zig-zag pattern. Plural image sensing cells are located in opposed relation to the plural enlarged portions 3A, but in the example shown in FIG. 6 the image sensing cells are arranged as follows. In the following description, the image sensing cells 2a are taken as $SA_1$ and the other image sensing cells 2b are taken as $SA_2$, respectively.

With the example shown in FIG. 6, the image carriers stored in the respective image sensing cells $SA_1$ and $SA_2$ are transferred in the vertical scanning direction not in the horizontal scanning direction. The reason is that when the image carrier is transferred to the vertical shift register 3 the transfer position can be always shifted to the position beneath a determined electrode and the carrier transferred to the vertical shift register 3 is prevented from being re-injected to the image sensing cells through the gate regions.

One of the image sensing cells $SA_1$ will be first described. The image carrier in the image sensing cell $SA_1$ is transferred in the direction parallel to the carrier transfer direction $a$ but opposite in sense in the vertical shift register 3. To this end, a gate region $ST_1$ for the image sensing cell $SA_1$ is formed between the image sensing cell $SA_1$ and enlarged portion 3A and at a side 14 of the enlarged portion 3A parallel to the horizontal scanning direction.

The image carrier in the other image sensing cell $SA_2$ is transferred in the same direction as the carrier transfer direction $a$ opposite to that in the image sensing cell $SA_1$, and a gate region $ST_2$ is provided for the image sensing cells $SA_2$ similarly.

A channel stopper 8B is formed among the image sensing cells $SA_1$ and $SA_2$ and vertical shift register 3. This channel stopper 8B is an auxiliary channel or sub-channel stopper, which is extended from a main channel stopper 8A substantially parallel to the vertical shift register 3, and has a T-shape in plane. A channel stopper 8 consisting of the main and sub-channel stoppers 8A and 8B is shown in FIG. 6 with oblique lines down to the left.

The semiconductor region within the main channel stopper 8A by dotted lines indicates an over flow drain region 9, and regions $OG_1$ and $OG_2$ formed among the region 9 and image sensing cells $SA_1$ and $SA_2$ are gates for transferring excess image carriers to the region 9.

In the solid state imager 10 of this invention shown in FIG. 6, the positions of electrodes $\phi_1$ and $\phi_2$ which are formed on the vertical shift register 3 are determined as follows. The electrode formed on the narrow portion 3B is the second electrode $\phi_2$ and a transfer region $\phi_2 T$ is selected to be positioned on the narrow portion 3B. In this case, a region 16 of the sub-channel stopper 8B which is parallel to the vertical shift register 3 is selected such that a front edge 16a of the region 16 in the transfer direction $a$ and the front edge of the second electrode $\phi_2$ or front edge 17 of the transfer region $\phi_2 T$ are at least coincident with each other.

Figure 9A:
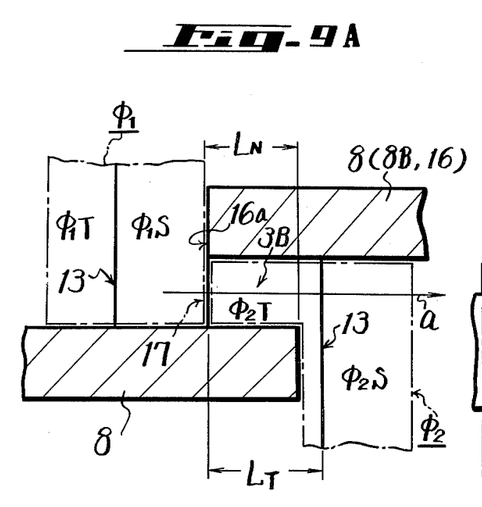
FIG. 9A is another example of this invention and FIG. 9B is a sectional view of the example of FIG. 9A.

Next, one example of electrode formation, which will satisfy the above electrode selecting condition, will be described with reference to FIGS. 9A and 9B. FIG. 9A shows an enlarged plane view in which a length $L_N$ of the narrow portion 3B is selected shorter than a length $L_T$ of the transfer region $\phi_2 T$, and FIG. 9B is a cross-sectional view of FIG. 9A.

Figure 9B:
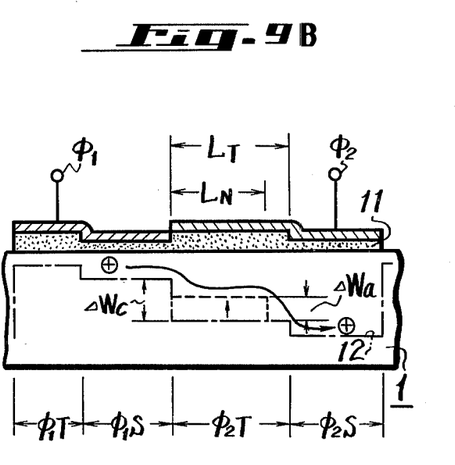

Since the first and second electrodes $\phi_1$ and $\phi_2$ are supplied with desired transfer signals, respectively, a potential well caused by the transfer signals appears as a stepped potential well 12 in response to the respective regions $\phi_1 T$, $\phi_1 S$, $\phi_2 T$ and $\phi_2 S$ as shown in FIG. 9B by one-dot-chain line, which was described previously. In this case, however, the depth of the potential well 12 in the narrow portion 3B becomes shallower by $\Delta W_a$ than a designed value, so that this potential well is shown by dotted lines in FIG. 9B.

In fact, if the level difference between the transfer signals fed to the electrodes $\phi_1$ and $\phi_2$ is selected, a potential difference $\Delta W_c$ between the potential wells formed beneath the electrodes $\phi_1$ and $\phi_2$ can be changed desirably. Therefore, if the levels of transfer signals are selected to satisfy the condition $\Delta W_c > \Delta W_a$, the potential well 12 becomes sequentially deeper in the transfer direction $a$ even though the potential well beneath the narrow portion 3B is shallow by $\Delta W_a$. As a result, if image carriers are stored in, for example, the storage region $\phi_1 S$ of the first electrode $\phi_1$, the image carriers can be transferred to the next storage region $\phi_2 S$, positively.

If the electrodes $\phi_1$ and $\phi_2$ are formed to have the above relation, the image carriers can be transferred without being affected by the narrow portion 3B.

Another relationship of electrodes, which may transfer the image carriers without being affected by the narrow portion 3B, can be considered in addition to the example shown in FIG. 9.

Figure 10A:
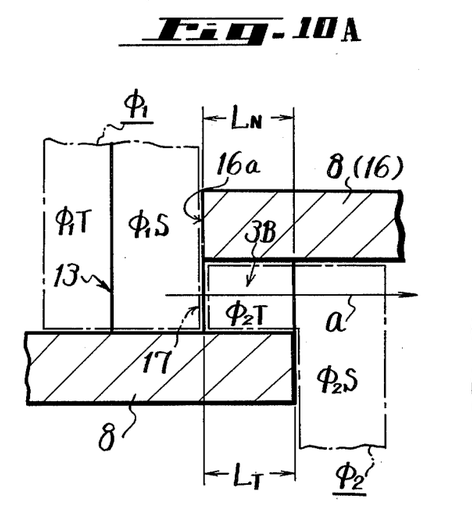
FIG. 10A and FIG. 11A are further examples of this invention and FIG. 10B and FIG. 11B are their sectional views, respectively.
Figure 10B:
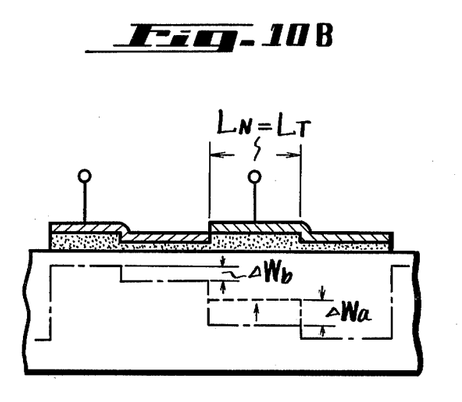
Figure 11A:
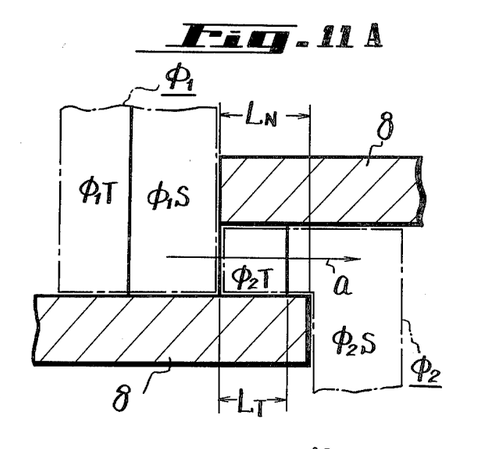
Figure 11B:
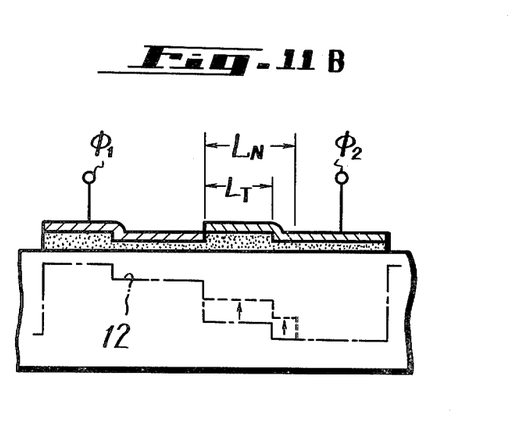

FIGS. 10 and 11 show such other examples, respectively. In the example FIG. 10 the length $L_N$ of the narrow portion 3B is selected to be the same as the length $L_T$ of the transfer region $\phi_2T$, and in the example of FIG. 11 the length $L_N$ is selected longer than the length $L_T(L_N > L_T)$, respectively. The potential wells 12 formed in the examples become as shown in FIGS. 10B and 11B, respectively, so that the image carriers can be transferred also.

In conclusion, if the positional relation of the transfer region $\phi_2T$ is selected such that the front edge 16a of the parallel region 16 of the sub-channel stopper 8B coincides with the front edge 17 of the transfer region $\phi_2T$ of the electrode $\phi_2$, the image carriers can be transferred regardless of the length $L_T$ of the transfer region $\phi_2T$.

Figure 12A:
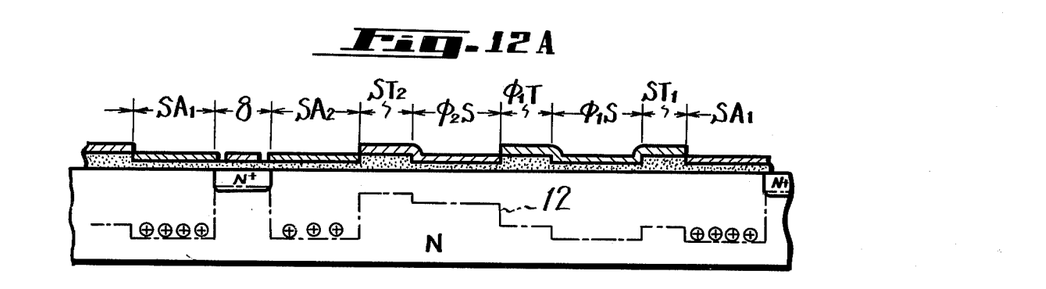
FIG. 12A and FIG. 12B are sectional views of the CCD imaging device of FIG. 6 for explaining the transfer mechanism from the sensing cells to the vertical shift register.
Figure 12B:
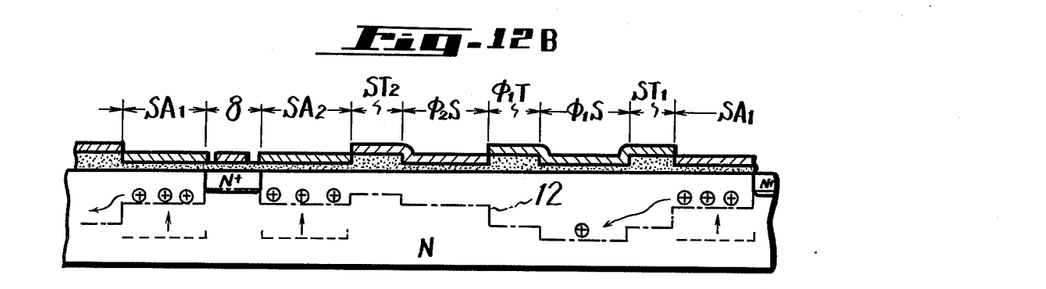

The carrier storage and transfer by the solid state imager 10 of the present invention shown in FIG. 6 will be described briefly with reference to FIGS. 12A and 12B which are sectional views on the line II—II in FIG. 6 and show the carrier storage, respectively. Since the solid state imager 10 shown in FIG. 6 employs the interlace system, a description will be given of a case where the image carriers corresponding to one of the image sensing cells or image sensing cell $SA_1$ are transferred. In order to store image carrier in the image sensing cells $SA_1$ and $SA_2$, the potentials of signals applied to the respective electrodes are selected to produce a potential well 12 as shown in, for example, FIG. 12A. Thus, image carriers are induced in the image sensing cells $SA_1$ and $SA_2$, so that by changing the potential well 12 shown in FIG. 12A into that 12 shown in FIG. 12B at the next instance, the image carrier induced in the image sensing cell $SA_1$ is stored in the portion beneath the storage region $\phi_1S$ through the gate region $ST_1$. In this case, since the gate region $ST_1$ is supplied with the same voltage as that applied to the electrodes $\phi_1T$ and $\phi_1S$, the potential at the gate region $ST_1$ becomes deeper than that at the image sensing cell $SA_1$, and accordingly the image carrier in the image sensing cell $SA_1$ is transferred to the electrode $\phi_1S$. However, since the other gate region $ST_2$ is supplied with the same voltage as that applied to the electrodes $\phi_2T$ and $\phi_2S$, the potential at the gate region $ST_2$ is shallower than that at the image sensing cell $SA_2$ and accordingly the image carrier in the image sensing cell $SA_2$ is not transferred to the electrode $\phi_2S$. Thus stored image carriers are transferred to the horizontal shift register 4 during the horizontal scanning period.

Figure 13A:
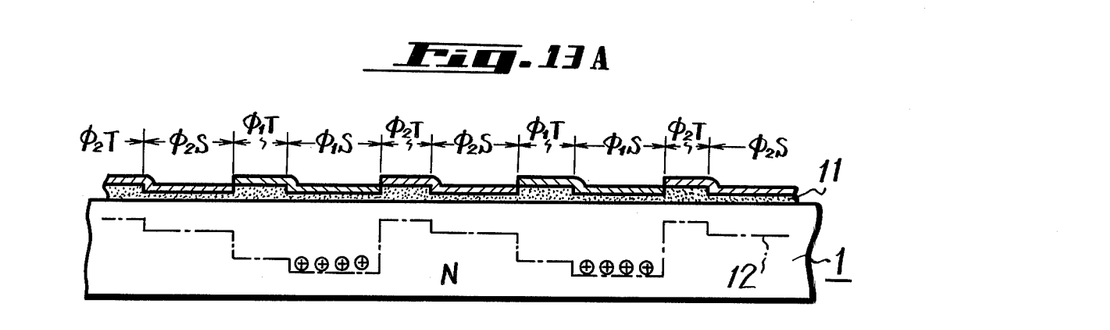
FIGS. 13A and 13B are sectional views of CCD imaging device of FIG. 6 for explaining the transfer mechanism of the vertical shift register.
Figure 13B:
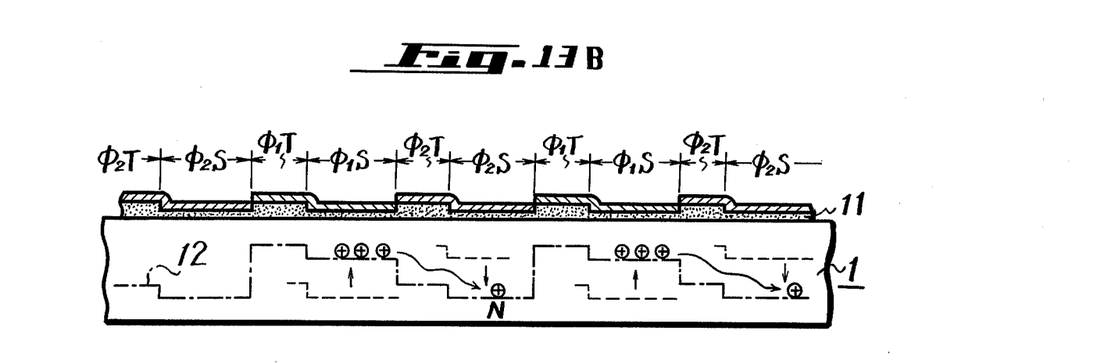

FIGS. 13A and 13B show the transfer state of the vertical shift register 3 shown in FIG. 6. Since the state of FIG. 12B is equivalent to that shown in FIG. 13A, the image carriers stored in the respective storage regions $\phi_1S$ are transferred to the following storage regions $\phi_2S$ as shown by the arrows in FIG. 13B, and when the potential well 12 shown in FIG. 13A is changed into that 12 shown in FIG. 13B. Accordingly, if the above operation is repeated, the image carriers can be transferred to the horizontal shift register 4.

Next, an example, which produces a video signal by using the solid state imager 10 constructed as above, will be described. Since the solid state imager 10 shown in FIG. 6 is formed in consideration of the interlace scanning system, it is necessary that when the informations of the image sensing cells on the even horizontal scanning lines in the odd horizontal scanning line group 5a of, for example, odd fields are used, the informations of the image sensing cells before 1H (where H represents one horizontal period) or on the odd horizontal scanning lines in the odd horizontal scanning line group 5a should be also used. The above is similar for the even fields.

Figure 14:
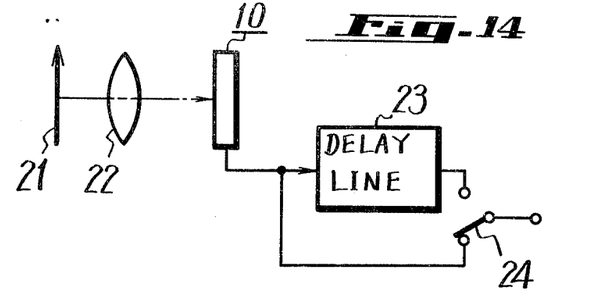
FIG. 14 shows a read out circuit to be used together with the CCD imaging device of FIG. 6.

To this end, it is sufficient to provide a circuit system shown in FIG. 14 which produces a video signal from the solid state imager 10. In FIG. 14, 21 indicates an object to be picked up, 22 an optical lens system, 23 a delay line of 1H, and 24 a switch which is switched at every image sensing cell, by which the light information at present and the light information before 1H are read out alternately at every image sensing cell and light informations for 2H are obtained during 1H to produce the light informations including those corresponding to parts of the solid state imager 10 where no image sensing cells exist. In general, since there exists the vertical correlation, the picture is not substantially deteriorated by the above signal processing. If the number of image sensing cells in the horizontal scanning direction is selected to be about ⅔ of the prior art, a sufficient picture can be obtained. Though not shown in the figure, for the spacial position matching of image sensing cells the light informations are delayed by ½ of the image sensing cell period at every 1H.

Figure 15:
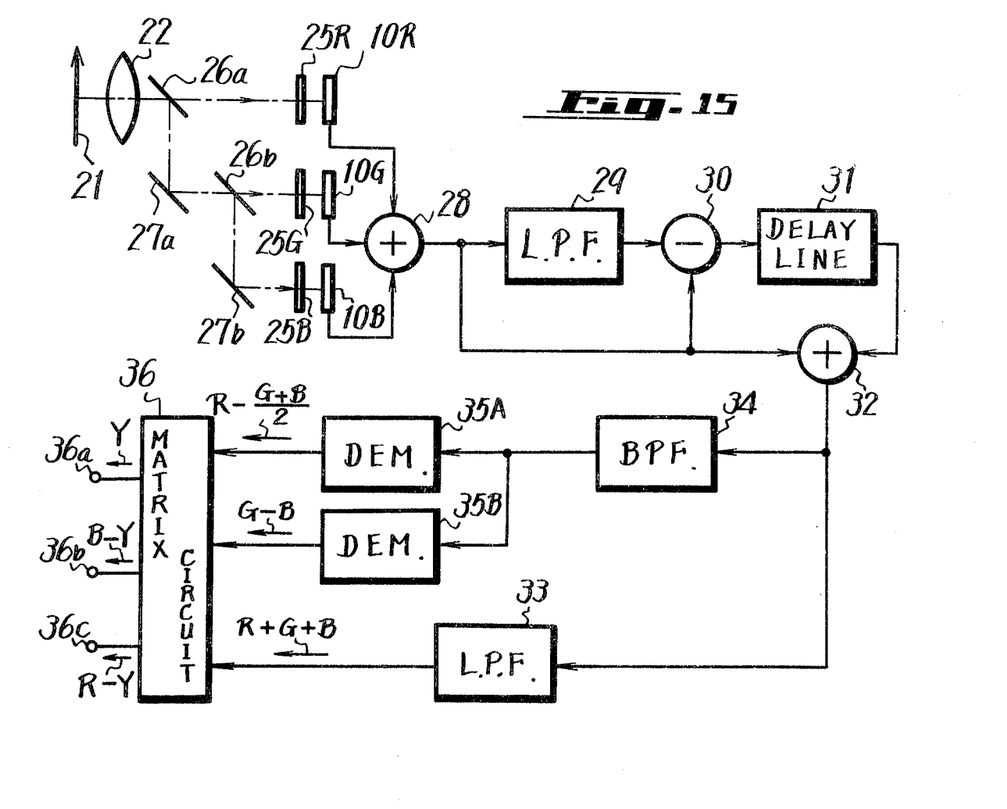
FIG. 15 is a peripheral circuit diagram of color television systems which employ three CCD imaging devices of FIG. 6, and FIGS. 16 and 17 are partial views for explaining advantages of the transfer efficiency of the invention by comparing two examples of shapes of electrodes for the vertical shift register.

FIG. 15 shows a system for carrying out a color image pick-up by using the solid state imager of this invention. In this case, three of solid state imagers 10R, 10G and 10B, each corresponding to that 10 described above, are used. Mono-color filters 25R(red), 25G(green) and 25B(blue) are located in front of the solid state imagers 10R, 10G and 10B, respectively, so as to project color-separated images of the object 21 on the images 10R to 10B, respectively. In FIG. 15, $26_a$ and $26_b$ indicate half mirrors, and $27_a$ and $27_b$ mirrors, respectively.

In this case, the relative positional relation of the color-separated images to the corresponding solid state imagers 10R to 10B are selected to be shifted by ⅓ $\tau H$ sequentially (where $\tau H$ represents the alignment pitch of image sensing cells in the horizontal scanning direction) in the horizontal scanning direction, so that the color-separated images are projected on the solid stage imagers 10R to 10B by the phase difference of 120° in view of phase.

The video output signals from the respective solid state imagers 10R to 10B are read out sequentially and alternately one by one (image sensing cell), and then fed through an adder 28 to a low pass filter 29 whose cut off frequency is about 2 MH$_z$. The reason why the low pass filter 29 is used is that, in order to prevent the vertical resolution from being deteriorated in association with construction described later, the low band components which may interfere the vertical resolution are not subjected to the signal processing.

The output signal from the low pass filter 29 and the output or composite signal from the adder 28 which is not limited in band are supplied to a subtractor 30 which then produce a high band component only. The high band component from the subtractor 30 is delayed by 1H (by a delay line 31) and then fed to an adder 32 which is also supplied with the composite signal from the adder 28. Thus, the output signal from the adder 32 contains low band components which do not pass through the operational treatment system, but is fed to a low pass filter 33 whose cut off frequency is 5.0 MH$_z$ which then produces modulated (DC) components.

The output signal from the adder 32 is fed also to a band pass filter 34 and then to demodulators 35A and 35B having desired demodulation (detection) axes to demodulate color components. By way of example, the color component of R − [(G+B)/2] is demodulated by the demodulator 35A and the color component of G − B is demodulated by the demodulator 35B, respectively, so that if these color components and the modulated component R + G + B from the low pass filter 33 are supplied to a matrix circuit 36, desired signals, for example, the luminance signal Y and color difference signals (R − Y) and (B − Y) of the NTSC system can be obtained at terminals $36_a$, $36_b$ and $36_c$ led out from the matrix circuit 36, respectively.

As described above, with the present invention the single vertical shift register 3 is used in common for adjacent two rows of image sensing cells; the image sensing cells 2 are arranged in a zig-zag pattern; and the electrode attached to the narrow portion 3B of the vertical shift register 3 is specified. That is, the front edge $16_a$ of the sub-channel stopper 8B is selected to coincide with the front edge 17 of the transfer region $\phi_2 T$ of the second electrode $\phi_2$.

If the electrodes are selected and positioned as described above, the carrier transfer becomes positive and effective, which can avoid the defects encountered in the prior art where the carriers can not be transferred or some of carriers remain without being transferred which deteriorates the picture quality.

Further, with the invention upon forming the electrodes it is sufficient to match a mask in such a manner that the front edge $16_a$ of the parallel region 16 of the sub-channel stopper 8B coincides with the front edge 17 of the transfer region $\phi_2 T$ of the second electrode $\phi_2$, and it is not required to so strictly position the rear edge of the transfer region $\phi_2 T$. Therefore, the mask matching for forming the electrodes $\phi_1$ and $\phi_2$ becomes easier.

In the example shown in FIG. 6, the electrode to which the image sensing cells $SA_1$ and $SA_2$ are faced is one, respectively, and is apart from the other electrode in view of distance, so that there is no fear that due to mis-registration of the mask that the image carriers in the image sensing cell $SA_1$ will be transferred to the storage region $\phi_2 S$ of the second electrode $\phi_2$.

In fact, the carrier transfer in a solid state imager is deteriorated by the trapping caused by the phase boundary or interface level, so that in general the transfer efficiency is improved by the fat zero applied electrically or optically. Accordingly, if the area of the vertical shift register 3 is expanded as in the present invention, the influence of the trapping by the phase boundary level on the minority carrier can be reduced by the cooperation of fat zero to further improve the carrier transfer efficiency.

One of the standards determining whether the carrier transfer efficiency is high or not is the ratio of S/l where S is the storage area of the vertical shift register 3 and l is the length of one side (edge) which serves as the carrier trapping which is not covered even by the fat zero. In this case, the length of the edge serving as the carrier trapping is the length of an edge forming a boundary surface (interface), which is not covered by the fat zero, in the boundary surface of the depletion layer produced by the electrodes $\phi_1$ and $\phi_2$ for carrier transfer. In the prior art example shown in FIG. 16, boundary surfaces $40_a$ and $40_b$ perpendicular to the carrier transfer direction $a$ are covered by the fat zero and the transfer of signal carriers, so that the length of edges (with oblique lines) of the boundary surfaces other than the above becomes a problem.

Figures 16, 17:
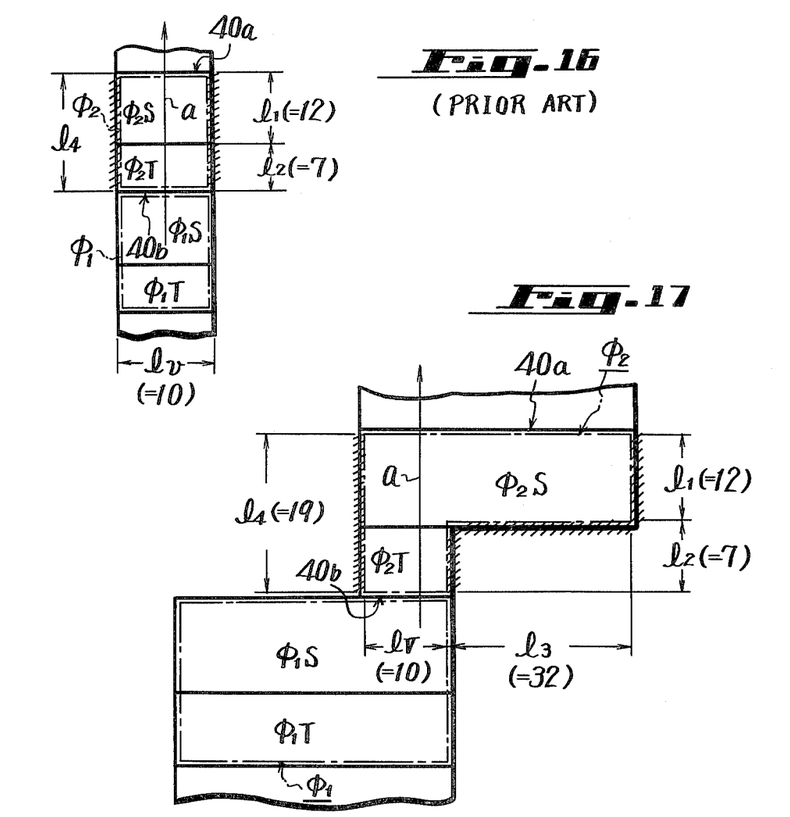

Thus, if the length $l$ of the edges is smaller than the storage area S or the ratio S/l is great, the trapping is affected less on the boundary surfaces, and accordingly the transfer efficiency can be improved.

By way of example, in case of FIG. 16, $S/l = l_v \cdot l_1/2l_4 = 3.2$, but with the present invention, as shown in FIG. 17, $$l = l_1 + l_2 + l_3 + l_4 = 12 + 7 + 32 + 19 = 70 \, (\mu m)$$

and $$S = l_1 \cdot (l_3 + l_v) = 504 \, (\mu m^2)$$

Therefore, with the present invention the ratio S/l become about 7.2($S/l \approx 7.2$), which means that the transfer efficiency is greatly improved.

Further, in association with the expansion of the electrode, the amount of carriers handled increases, so that noise can be, of course, reduced.

It will be apparent that many modifications and variations could be effected by those skilled in the art without departing from the spirits or scope of the novel concepts of the present invention, so that the scope of the invention should be determined by the appended claims.

We claim as our invention:
1. A solid state imaging device comprising:
   (a) a plurality of sensing cells aligned in both horizontal and vertical directions;
   (b) a plurality of vertical shift registers positioned between every two lines of said sensing cells aligned in the vertical direction transferring signal charge in one direction, each of said vertical shift registers comprising plural sets of transfer and storage portions, said transfer portions having higher surface potential relative to the surface potential of the successive storage portions to prevent the signal charge flow in the direction opposite to said one direction, said storage portions receiving a signal charge from the sensing cells or a preceding storage portion, a first pair of said storage portions extending to one vertical alignment side of said associated sensing cells, a second pair of said storage portions succeeding said first pair and extending to a second vertical alignment side of said associated sensing cells, and a front edge of certain ones of said transfer portions in respect to the direction of signal charge flow coinciding with a front edge of a narrow portion of said vertical shift register formed between said first and second pairs of said storage portions; and
   (c) a horizontal shift register for receiving image carriers from said vertical shift registers and for deriving an output video signal.

2. A solid state imaging device as cited in claim 1, wherein each of said sensing cells has a transfer gate for transferring said image carriers to a predetermined one of said storage portions of said vertical shift register.

3. A solid state imaging device as cited in claim 2, wherein 2-phased clock pulses are alternately applied to each set of said transfer portion and storage portion of said vertical shift register.

4. A solid state imaging device comprising:
   (a) a plurality of sensing cells aligned in both horizontal and vertical directions, each of said sensing cells comprising a pair of sensing elements aligned in vertical direction;

(b) a plurality of vertical shift registers mounted for transferring image carriers in one direction positioned between every two lines of said sensing elements and aligned in the vertical direction, comprising a plurality of alternate rows of transfer and storage portions, said transfer portions having a higher surface potential relative to the surface potential of the successive storage portions in the direction of carrier flow to prevent signal carrier flow in the direction opposite to said one direction, said storage portions receiving signal charges from said sensing cells or a preceding storage portion, a first pair of said storage portions extending to one vertical alignment side of said associated sensing elements, a second pair of said storage portions succeeding said first pair and extending to a second vertical alignment side of said associated sensing cells, a narrowed portion in the vertical shift register formed between each first and second pairs of said storage portions and extending in said one direction; and (c) a horizontal shift register receiving image carriers from said vertical shift registers and for deriving an output video signal, including the improvement comprising the front edge of said transfer portion in respect to the direction of charge flow coincides with a front edge of said narrowed portion of said vertical shift register.

5. A solid state imaging device according to claim 4, in which said plurality of sensing cells are each associated with a corresponding storage portions.

6. A solid state imaging device according to claim 5 in which said image carriers generated in said sensing cells are transferred to the storage portions in a direction substantially parallel to said vertical shift register.

7. A solid state imaging device according to claim 4, in which each of said sensing cells of said sensing element are isolated by a channel stopper.

8. A solid state image device according to claim 4, in which each of said sensing cells is associated to a storage portion and a transfer gate portion.

9. A solid state imaging device comprising:

(a) a plurality of sensing cells aligned in both horizontal and vertical directions, each of said sensing cells comprising a pair of sensing elements aligned in the vertical direction;

(b) a plurality of vertical shift registers mounted for transferring image carriers in one direction, said vertical shift registers being defined by a region of a first impurity concentration bordered by a region of a second impurity concentration which is higher than the first impurity concentration, comprising a plurality of alternate rows of transfer and storage portions, said transfer portion having a higher surface potential relative to the surface potential of a successive storage portion to prevent the image carrier flow in the direction opposite to said one direction, said storage portions receiving the image carrier from said sensing elements or the preceding storage portions, a first pair of said storage portions extending to one side of the vertical alignment side of said associated sensing elements, a second pair of said storage portions succeeding said first pair and extending to a second vertical alignment side of said associated sensing cells, a narrowed portion formed between each of said first and second pairs of said storage portions and extending in said one direction, and (c) a horizontal shift register for receiving the image carriers from said vertical shift registers and for deriving an output video signal, the improvement comprising a front edge of said transfer portion relative to the direction of the image carrier flow coinciding with a front edge of said narrowed portion of said vertical shift register.

10. A solid state imaging device according to claim 9 wherein each of said sensing elements are mounted adjacent extending portions of said storage portions so as to transfer an image carrier in the direction parallel to said one direction of image carrier flow in the vertical shift register.

* * * * *